United States Patent
Mathur et al.

(10) Patent No.: US 7,724,042 B2
(45) Date of Patent: May 25, 2010

(54) REDUCING POWER CONSUMPTION IN AN AMPLIFICATION STAGE DRIVING A SAMPLE AND HOLD CIRCUIT WHILE MAINTAINING LINEARITY

(75) Inventors: Sumeet Mathur, Bangalore (IN); Ankit Seedher, Bangalore (IN); Preetam Charan Anand Tadeparthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 11/774,017

(22) Filed: Jul. 6, 2007

(65) Prior Publication Data

US 2009/0009219 A1  Jan. 8, 2009

(51) Int. Cl.
*H03K 5/00* (2006.01)
(52) U.S. Cl. .......................................... 327/91; 327/94
(58) Field of Classification Search ........................ None
See application file for complete search history.

(56) References Cited

U.S. PATENT DOCUMENTS

| | | | | |
|---|---|---|---|---|
| 4,555,669 A | * | 11/1985 | Namiki | 330/149 |
| 4,577,161 A | * | 3/1986 | Hirohashi et al. | 330/149 |
| 4,584,559 A | * | 4/1986 | Penney | 341/122 |
| 6,476,671 B1 | * | 11/2002 | Tang | 330/9 |
| 6,653,895 B1 | * | 11/2003 | Douts et al. | 330/9 |
| 6,674,309 B1 | * | 1/2004 | Mercer et al. | 327/9 |
| 6,700,417 B2 | * | 3/2004 | Kawahito et al. | 327/94 |
| 7,518,414 B2 | * | 4/2009 | Romero et al. | 327/96 |
| 2006/0164021 A1 | * | 7/2006 | Ryu et al. | 315/209 R |
| 2008/0018392 A1 | * | 1/2008 | Nolan et al. | 330/9 |
| 2008/0178227 A1 | * | 7/2008 | Petrovic et al. | 725/68 |
| 2008/0204582 A1 | * | 8/2008 | Keel et al. | 348/294 |
| 2009/0009219 A1 | * | 1/2009 | Mathur et al. | 327/94 |
| 2009/0085632 A1 | * | 4/2009 | Yagyu et al. | 327/307 |

* cited by examiner

*Primary Examiner*—Tuan Lam
*Assistant Examiner*—Hiep Nguyen
(74) *Attorney, Agent, or Firm*—John J. Patti; Wade J. Brady, III; Frederick J. Telecky, Jr.

(57) ABSTRACT

An input signal to be sampled by a sample and hold circuit is amplified separately by two amplifiers. The output of the first amplifier is provided to a boost circuit to maintain the impedance of a sampling switch contained in a signal dependent boost switch substantially constant. The output of the second amplifier is sampled via the sampling switch, and the sample is stored in a storage element. The second amplifier drives a reduced load, and may be implemented as a low bandwidth, low power amplifier to reduce overall power consumption.

17 Claims, 2 Drawing Sheets

REDUCING POWER CONSUMPTION IN AN AMPLIFICATION STAGE DRIVING A SAMPLE AND HOLD CIRCUIT WHILE MAINTAINING LINEARITY

BACKGROUND

1. Field of the Invention

The present invention relates generally to sample and hold circuits, and more specifically to a technique for reducing power consumption in an amplification stage driving a sample and hold circuit while maintaining linearity.

2. Related Art

A sample and hold circuit generally refers to a circuit which samples a signal at corresponding time instances, and stores the samples for further processing. For example, a sample and hold circuit may be used to provide samples of an analog signal to an analog to digital converter (ADC) for conversion to corresponding digital codes.

Frequently, one or more amplification stages are used to provide an amplified version (for example, amplified current and/or voltage) of an input signal to a sample and hold circuit. The signal stored in the sample and hold circuit is provided to subsequent components for further processing.

It is therefore generally desirable that the strengths (charge/voltage) of the samples stored by a sample and hold circuit be linearly proportional to the strengths of the input signal at the corresponding (sampled) time instances.

In a prior technique, an amplifier driving a sample and hold circuit is implemented as a high bandwidth amplifier, consuming higher power, to provide an acceptable level of linearity between the captured samples and the actual input signal strengths at the capture time instances. Such higher power consumption is generally undesirable.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

Overview

According to an aspect of the present invention, an input signal to be sampled by a sample and hold circuit is amplified separately by two amplifiers. The output of the first amplifier is provided to a boost circuit to maintain the impedance of a sampling switch contained in a signal dependent boost switch substantially constant. The output of the second amplifier is provided to a storage element via the sampling switch to store a sample of the (amplified) input signal.

Due to the presence of the first amplifier, non-linearity caused by the sampling switch is minimized. In addition, as the load presented by the boost circuit is presented to the first amplifier, the second (main) amplifier driving the signal path needs to drive a smaller load, and may thus be implemented as a low bandwidth, low power amplifier. Overall the power consumption of a sample and hold circuit may thus be reduced while still satisfying linearity requirements.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Environment

Figure 1:
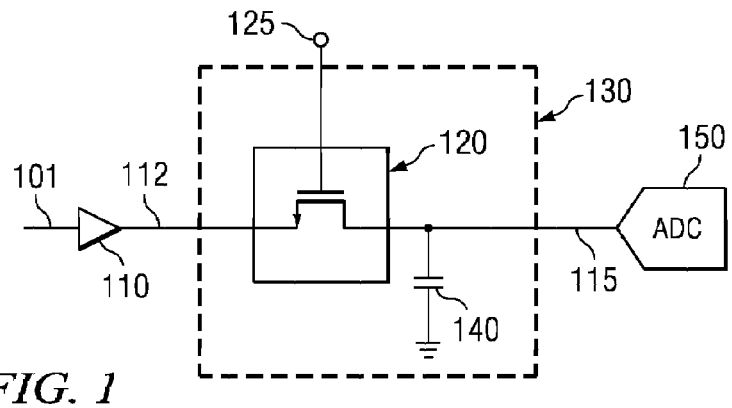
FIG. 1 is a block diagram of an example environment in which several aspects of the present invention can be implemented.

FIG. 1 is a block diagram of an example environment in which several aspects of the present invention can be implemented. The diagram is shown containing amplifier 110, sample and hold circuit 130, and analog to digital converter (ADC) 150 in one embodiment. Each component is described below in detail.

Although shown in the figure as separate components, amplifier 110, sample and hold circuit 130, and analog to digital converter (ADC) 150 may be implemented in integrated form inside a single integrated circuit (IC). Further, sample and hold circuit 130 may, in general, be implemented with more or fewer components, and (along with amplifier 110) may be designed to process single-ended and/or differential input signals.

Amplifier 110 receives an input signal (for example, an analog signal) on path 101, and provides an amplified version of the signal on path 112. ADC 150 receives a stored sample of (amplified) input signal 101 on path 115, and operates to generate a corresponding digital code.

Sample and hold circuit 130 is shown containing switch 120 and capacitor 140 (an example of a storage element). Switch 120 is shown implemented as a semiconductor switch (e.g., Metal Oxide Semiconductor/MOS transistor) and operates to connect path 112 to path 115 (which maybe referred to as a sampling path), thereby causing capacitor 140 to be charged (i.e., to store a sample of the amplified input signal). A source terminal of switch 120 is connected to path 112, a drain terminal to path 115, and a gate terminal to signal 125.

Assuming switch 120 is implemented as an NMOS switch, a logic 1 on gate terminal 125 turns switch 120 ON, connecting path 112 to path 115. A logic 0 on gate terminal 125 turns switch 120 OFF, disconnecting path 112 from path 115. However, switch 120 maybe implemented using other technologies such as PMOS.

During a sampling phase, signal 125 closes switch 120 (to establish connectivity between paths 112 and 115), and a sample of the amplified signal 112 is stored (by charging) in capacitor 140. During a hold phase, signal 125 opens switch 120, and the stored sample is available to ADC 150 for conversion to a corresponding digital code.

The presence of switch 120 in the signal path during the charging of capacitor 140 may cause the stored samples to have a non-linear relationship with the actual input signal strengths at the corresponding time instances. As is well known in the relevant art, the impedance presented by switch 120 (referred to also as a signal dependent switch) while in an ON state is generally proportional to the strength of the signal at the source (path 112), since the gate-to-source potential of the switch is usually a function of the input signal present at the source terminal. As a result, the samples stored in capacitor 140 may not be linearly proportional to corresponding signal strengths on path 112 (at the sampled time instances/durations).

According to one approach, elimination/reduction of such non-linearity requires maintaining the impedance of switch 120 substantially constant rather than proportional to the input signal during a sampling phase (ON duration). Thus, a relatively constant gate-to-source potential may be needed to be maintained during sampling phases (every time switch 120 is closed).

A circuit provided according to an aspect of the present invention provides such constant gate-to-source potential. The features/advantages of such a circuit can be appreciated in comparison to a prior technique. Accordingly, such a prior technique for maintaining impedance of a sampling switch constant is described next.

3. Prior Technique

Figure 2:
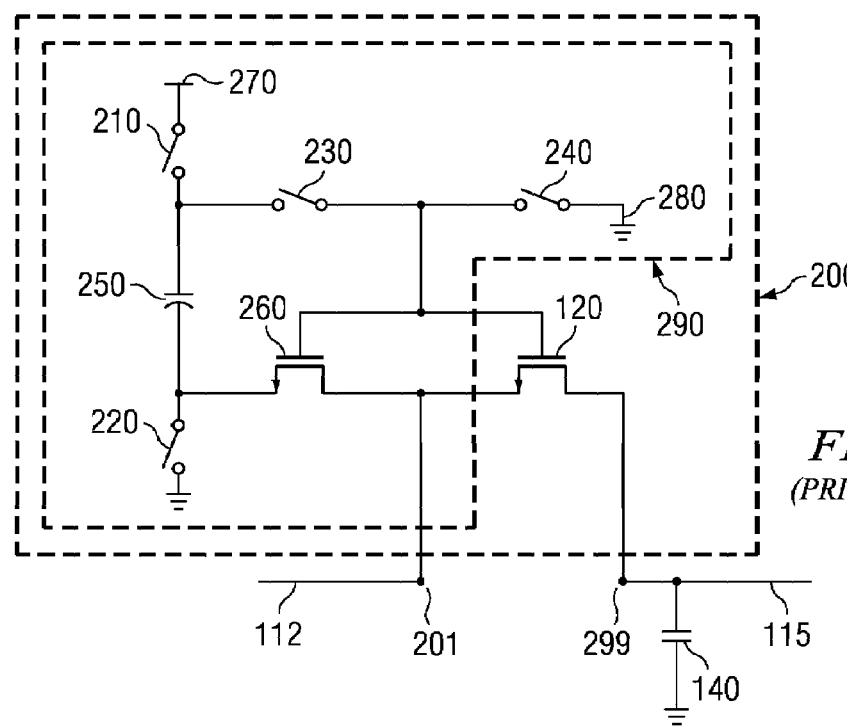
FIG. 2 is a block diagram illustrating a prior circuit implemented to maintain the impedance of a sampling switch used in a sample and hold circuit constant.

FIG. 2 shows a block diagram illustrating a prior circuit implemented to maintain the impedance of a sampling switch used in a sample and hold circuit constant. Merely for illustration, the boost circuit there is shown operating in conjunction with signals 112 and 115 of FIG. 1.

Signal dependent boost switch 200 is shown containing boost circuit 290 and switch 120. Boost circuit 290 is shown containing switches 210, 220, 230 and 240, boost capacitor 250, and MOS transistor 260, and is connected to switch 120 as shown in the figure. Capacitor 140 of FIG. 1 is also shown for ease of description. The operation of signal dependent boost switch 200 is described next briefly.

During a hold phase, switches 210, 220 and 240 are closed, and switch 230 is open. Consequently, gate terminals of MOS transistors 260 and 120 are connected to ground 299, and boost capacitor 250 is charged to a constant voltage Vc via power supply terminal 201.

During a sampling phase, switch 230 is closed, while switches 210, 220 and 240 are open. Thus, during a sampling phase, signal 112 causes the potential at the gate terminal of MOS switch 120 to be the sum of Vc and the signal strength of signal 112. Thus, assuming the strength of signal 112 is represented by Vin, the gate terminal of switch 120 is Vc+Vin, and the gate-to-source potential of switch 120 is maintained at a constant voltage Vc. Therefore, the impedance of switch 120 is also maintained substantially constant. Switches 210, 220, 230 and 240 may be controlled by corresponding waveforms not shown in the figure.

However, the approach of FIG. 2 has a drawback in that, although the non-linearity caused by sampling switch 120 is avoided, boost circuit 290 (particularly boost capacitor 250, which is often fairly large in value) presents an additional load to the amplifier providing signal 112 (amplifier 110 of FIG. 1). Thus, amplifier 110 has to first charge boosting capacitor 250 to close sampling switch 120, and also charge sampling capacitor 140.

As a result, the amplified output 112, and therefore the samples stored in capacitor 140 may have a have a non-linear relation with respect to input signal 101. To overcome such non-linear effects, amplifier 110 may be implemented as a high-bandwidth amplifier which may consume a large amount of power.

The approaches provided according to several aspects of the present invention overcome some of the drawbacks noted above, while meeting the linearity requirement.

4. Reducing Power Consumption in Amplification Stage

Figure 3:
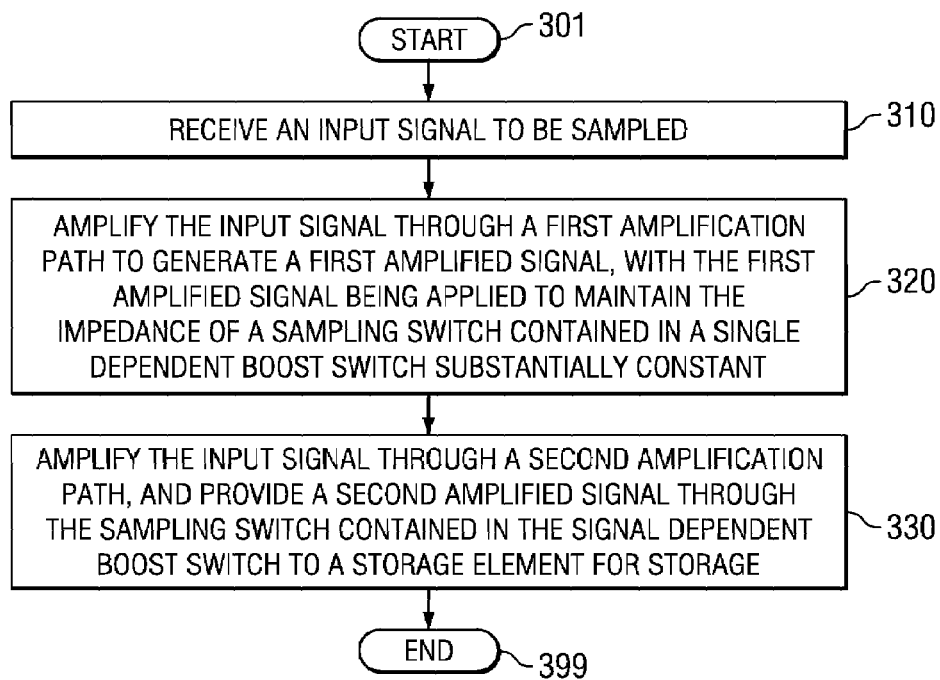
FIG. 3 is a flowchart illustrating the manner in which power consumption may be reduced in an amplification stage driving a sample and hold circuit while still maintaining linearity.

FIG. 3 is a flowchart illustrating the manner in which power consumption may be reduced in an amplification stage driving a sample and hold circuit while still maintaining linearity according to an aspect of the present invention. The description of the flowchart is provided with respect to the circuits of FIG. 1 merely for illustration. However, various features can be implemented in other environments and with other components as well. It must also be noted that while the steps as presented as a sequence, the operation of the steps may be performed concurrently, or in a different sequence. The flowchart starts in step 301, in which control passes immediately to step 310.

In step 310, an input signal to be sampled is received. The input signal can be received from external sources or generated internally within a device in which the flowchart of FIG. 3 is implemented. Control then passes to step 320.

In step 320, input signal is provided to a first amplification path to generate a first amplified signal, with the first amplified signal being applied to maintain an impedance of a sampling switch (sampling path) contained in a signal dependent boost switch substantially constant. As a result, non-linearity caused by the sampling switch is minimized/eliminated. The first amplification path may contain one or more amplifiers. Control then passes to step 330.

In step 330, the input signal is provided to a second amplification path to generate a second amplified signal. During a sampling phase, the second amplified signal is passed through the sampling switch contained in the signal dependent boost switch to store a sample of the (amplified) input signal by charging a storage element such as a sampling capacitor. Control then passes to step 399 in which the flowchart ends.

Thus, a separate amplification path (containing amplifiers) is used for driving the boost circuit, and the amplifier driving the sampling capacitor(s) is not loaded by the capacitive load presented by the boost circuit. The amplifier driving the sampling capacitor(s) may thus be implemented as a low-bandwidth/low power amplifier, while still ensuring a linear response. Further, the amplifier driving the sampling capacitor can be independently optimized for power reduction based on the actual sampling capacitance load.

The features of FIG. 3 can be implemented in various embodiments. The description is continued with respect to an example embodiment implementing at least some of the features of FIG. 3.

5. Example Embodiment

Figure 4:
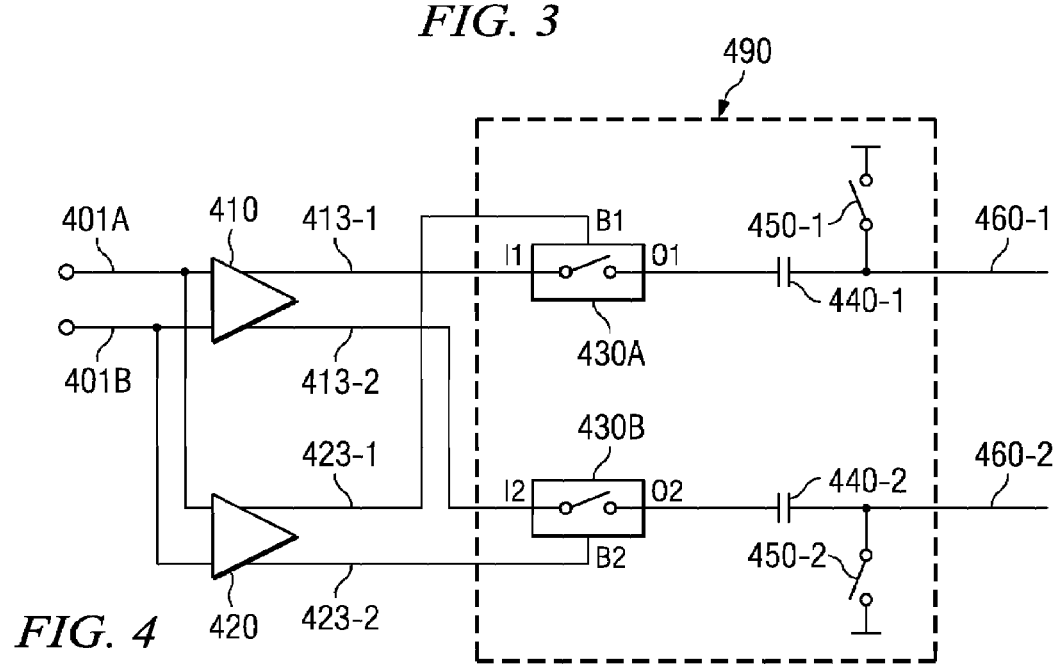
FIG. 4 is a block diagram of an example embodiment of the present invention.

FIG. 4 is a block diagram of a sample and hold amplifier in an embodiment of the present invention. While the example embodiment illustrates an implementation in the context of a differential input, similar implementations in the context of single-ended inputs can also be implemented, as will be readily apparent to one skilled in the relevant art by reading the disclosure provided herein.

The diagram is shown containing amplifiers 410 and 420, and sample and hold circuit 490. Sample and hold circuit 490 is in turn shown containing signal dependent boost switches 430A and 430B, sampling capacitors 440-1 and 440-2, and switches 450-1 and 450-2. The operation of the circuit of FIG. 4 is described next.

An analog input signal is received on path 401 (401A and 401B) in differential form. Amplifier 410 provides on path 413 (413-1 and 413-2) an amplified output of input signal 401 to charge sampling capacitors 440-1 and 440-2. Amplifier 420 provides on path 423 (containing 423-1 and 423-2) an amplified output of input signal 401 to maintain the impedance of sampling switches contained in signal dependent boost switches 430A and 430B at substantially constant levels. In an embodiment, amplified output on path 413 equals the amplified output on path 423.

Signal dependent boost switch 430A is shown containing input terminal I1, output terminal O1, and boost terminal B1. Similarly, signal dependent boost switch 430B is shown containing input terminal I2, output terminal O2, and boost terminal B2. During a sampling phase, a sampling switch contained in each of signal dependent boost switches 430A and 430B is closed, thereby connecting terminal I1 to O1, and terminal I2 to O2. In addition to a sampling switch, each of signal dependent boost switches 430A and 430B contains a boost circuit designed to maintain the impedances of the respective sampling switches substantially constant.

Amplified output 423 (423-1 and 423-2) is applied to respective boost terminals B1 and B2 of signal dependent boost switches 430A and 430B, and operate to maintain the impedances of respective sampling switches contained in 430A and 430B substantially constant.

The amplified output 413 of input signal 401 charges sampling capacitors 440-1/440-2 to store a sample of the (amplified) input signal. Switches 450-1 and 450-2 are closed during a sampling phase and connect one end each of sampling capacitors 440-1 and 440-2 to a constant potential.

During a hold phase, sampling switches in signal dependent boost switches 430A and 430B, as well as switches 450-1 and 450-2 are open, and the sample stored in sampling capacitors 440-1/440-2 is available on paths 460-1/460-2 for further processing, such as analog to digital conversion. Operation of respective switches in the circuit of FIG. 4 may be controlled by appropriate waveforms/signals not shown.

It may be noted that the non-linearity contribution due to the sampling switches (contained in signal dependent boost switches 430A/430B) may be smaller than the non-linearity contribution due to the boost circuit (contained in signal dependent boost switches 430A/430B).

Thus, assuming amplifier 420 were not used in the circuit of FIG. 4, and that instead amplifier 410 had to drive both the boost circuit as well as the sampling switches (and sampling capacitors 440-1/440-2), considerably larger power consumption may be required in amplifier 410 because of the large extra load presented by the boost circuit. Since amplifier 410 participates in the actual sampling process on sampling capacitors 440-1/440-2, bandwidth requirements on it are much tighter, and hence it may require much more power to provide the required bandwidth if presented with the load of the boost circuit in addition. Amplifier 420 on the other hand may need to satisfy bandwidth requirements only for a secondary source of non-linearity and does not participate in the sampling process that requires much higher bandwidth. Hence, power consumption in amplifier 420 may be much smaller than a power increase otherwise required in amplifier 410 to drive the additional boost switch load. Thus, amplifier 420 in the circuit of FIG. 4 may be implemented as a low power amplifier. The description is continued with an illustration of a signal-dependent boost switch (such as switches 430A and 430B) in one embodiment.

6. Signal Dependent Boost Switch

Figure 5:
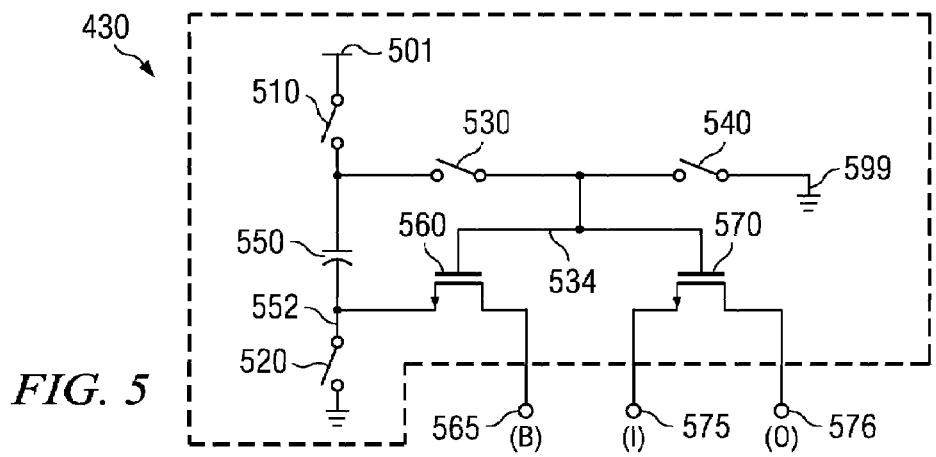
FIG. 5 is a circuit diagram of a signal dependent boost switch which may be used as a sampling switch in a sample and hold circuit according to several aspects of the present invention in one embodiment.

FIG. 5 is a circuit diagram of a signal dependent boost switch 430 which may be used in a sample and hold circuit in one embodiment. Although a specific circuit implementation of signal dependent boost switch 430 is shown and described below, it must be understood that other circuit configurations using different arrangement/interconnection of components may also be used to implement it. Further, although described as implemented using a specific type of switch/device (NMOS), it must be understood that signal dependent boost switch 430 may be implemented using other device types (for example, PMOS switches) as well, with appropriate circuit modifications. The operation of signal dependent boost switch 430 is described below in detail.

Signal dependent boost switch 430 is shown containing boost capacitor 550, switches 510, 520, 530 and 540, NMOS transistors 560 (also referred to as boost path switch 560 in some instances) and 570. NMOS transistor 570 constitutes a sampling switch (and referred to as sampling switch 570 henceforth), while boost capacitor 550, switches 510, 520, 530 and 540, and NMOS transistor 560 constitute a boost circuit for maintaining the impedance of the sampling switch substantially constant during a sampling phase.

The source, drain and gate terminals of sampling switch 570 are shown connected to paths 575 (I), 576 (O) and 534 respectively, while the source, drain and gate terminals of NMOS transistor 560 are shown connected to paths 552, 565 (Boost terminal B) and 534 respectively During a hold phase, switches 510, 520 and 540 are closed, and switch 530 is open. Consequently, gate terminals of NMOS transistors 560 and sampling switch 570 are connected to ground 599, and boost capacitor 550 is charged to a constant voltage Vc via power supply terminal 501.

During a sampling phase, switch 530 is closed, while switches 510, 520 and 540 are open. Thus, during a sampling phase, a signal (for example, 423-1/423-2) of strength Vin volts on path 565 (terminal B) causes the potential at the gate terminal of sampling switch 570 to be the sum of Vc and Vin. Thus, assuming the strength of signal on path 575 (output 413-1 or 413-2 of amplifier 410) is also Vin, the gate-to-source potential of sampling switch 570 is maintained at a constant voltage Vc.

Therefore, the impedance of sampling switch 570 (impedance of the sampling path represented by the path from terminal I (575) to terminal O (576) via sampling switch 570) is also maintained substantially constant. Switches 510, 520, 530 and 540 may be controlled by corresponding waveforms, generated by a clock generator (not shown in the figure). The waveforms need to be designed to turn the corresponding switches on/off, as described herein.

It may be noted by comparing FIGS. 5 and 2, that in switch 430 of FIG. 5 the path for the boost circuit (path traversing via terminal 565/terminal B, MOS transistor 560, boost capacitor 550, switch 530 and gate terminals of MOS transistor 560 and sampling switch 570) is separated from the signal path (575/terminal I, sampling switch 570 and 576/terminal O) that is used to charge the sampling capacitors (capacitors 440-1/440-2 of FIG. 4).

Thus, separate amplifiers are used to respectively drive the boost circuit and the signal path/sampling capacitors, as shown in the example embodiment of FIG. 4.

The sample and hold amplifier described above can be implemented in several different devices. The description is continued with respect to an example device in which a sample and hold amplifier thus provided, can be implemented.

7. Example Device

Figure 6:
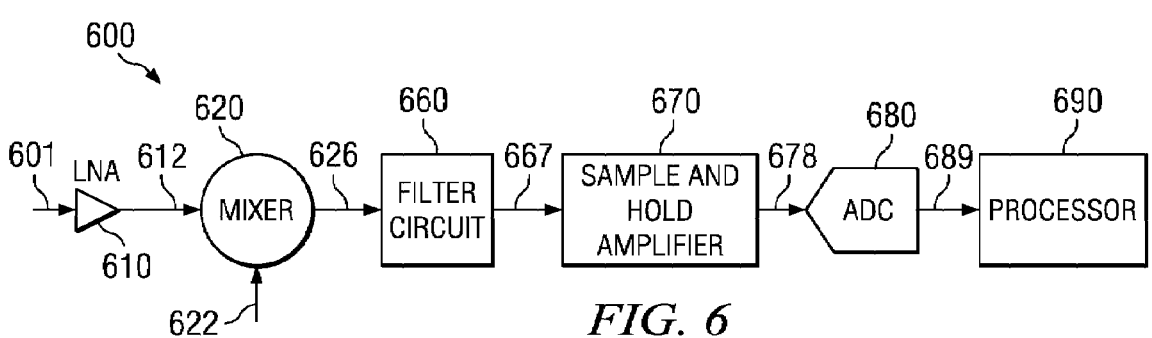
FIG. 6 is a block diagram of an example device/system in which several aspects of the present invention may be implemented.

FIG. 6 is a block diagram of receiver system 600 illustrating an example system in which various aspects of the present invention may be implemented. For illustration, it is assumed that receiver system 600 is implemented within a Wireless Receiver. However, receiver system 600 can be implemented in other devices (wireless as well as wire-based communications) as well. Receiver system 600 is shown containing low noise amplifiers (LNA) 610, mixer 620, filter circuit 660, sample and hold amplifier 670, analog to digital converter (ADC) 680, and processor 690. Each block/stage is described below in further detail.

LNA 610 receives signals on path 601 and amplifies the received signals to generate a corresponding amplified signal on path 612. For example, in wireless systems, the signals that are transmitted from satellites, etc. may be received by an antenna (not shown) and the received signals are provided on path 601. The received signals may be weak in strength and thus amplified by LNA 610 for further processing. LNA 610 may be implemented in a known way.

Mixer 620 may be used to down-convert the received amplified signal on path 612 into an intermediate signal with the frequency band of interest centered at a lower frequency than the carrier frequency of the received signal. In an embodiment, a signal with the frequency band of interest centered at 2.4 GHz (carrier frequency) is converted to a signal with the frequency band of interest centered at zero frequency.

Mixer 620 may receive the amplified signal on path 612 and a signal of fixed frequency on path 622 as inputs, and provides the intermediate signal on path 626. The signal of fixed frequency on path 622 may be generated by a phase locked loop (not shown) in a known way.

Filter circuit 660 may correspond to a low pass filter, which allows the desired low frequencies and rejects all other unwanted high frequencies present in the signal received on path 626. The filtered signal, which contains the frequency band of interest, is provided on path 667.

Sample and hold amplifier 670 operates to amplify and generate samples of the signal received on path 667, and provides the samples to ADC 680 on path 678.

ADC 680 converts (samples) the filtered signal received on path 678 to a corresponding digital value (forwarded on path 689), which represents the signal of interest in received signal 601. Processor 690 processes the received digital values to provide various user applications and may be implemented as multiple processing units, each potentially operating independently.

Sample and hold amplifier 670 may be implemented as shown in FIG. 4, according to several aspects of the present invention.

8. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A circuit for generating and storing samples of an input signal, the circuit comprising:
   a first amplifier that receives the input signal and that generates a first amplified signal;
   a second amplifier that receives the input signal and that generates a second amplified signal;
   a storage element;
   a signal dependent boost switch that is coupled to the first amplifier, the second amplifier and the storage element, wherein the signal dependent boost switch includes a sampling switch that is operable to provide the second amplified signal to the storage element, and wherein the first amplified signal maintains a substantially constant impedance for the sampling switch.

2. A circuit for generating and storing samples of an input signal, the circuit comprising:
   a first amplifier having an input terminal and an output terminal, wherein the input terminal of the first amplifier receives an input signal and wherein the first amplifier provides a first amplified signal;
   a second amplifier having an input terminal and an output terminal, wherein the input terminal of the second amplifier receives the input signal and wherein the second amplifier provides a second amplified signal;
   a first capacitor having a first and a second terminal;
   a signal dependent boost switch that is coupled to the output terminals of the first and the second amplifiers and that is coupled to the first terminal of the first capacitor, wherein the signal dependent switch includes a FET provides the second amplified signal to the first capacitor, and wherein the first amplified signal maintains a substantially constant impedance for the FET; and
   a first switch that is coupled between a first source and the second terminal of the first capacitor.

3. The circuit of claim 2, wherein the FET further comprises a first NMOS FET.

4. The circuit of claim 3, wherein the signal dependent boost switch comprises:
   a second switch having a first and a second terminal, wherein the first terminal of the second switch is coupled to a second source;
   a second capacitor having a first and a second terminal, wherein the first terminal of the second capacitor is coupled to the second terminal of the second switch;
   a third switch having a first and a second terminal, wherein the first terminal of the third switch is coupled to the second terminal of the second capacitor, and wherein the second terminal of the third switch is coupled to ground;
   a fourth switch having a first and a second terminal, wherein the first terminal of the fourth switch is coupled to the first terminal of the second capacitor;
   a fifth switch having a first and a second terminal, wherein the first terminal of the fifth switch is coupled to the second terminal of the fourth switch, and wherein the second terminal of the fifth switch is coupled to ground;
   the first NMOS FET is coupled to the output terminal of the second amplifier at its source, is coupled to the first terminal of the fifth switch at its gate, and is coupled to the first terminal of the first capacitor at its drain; and
   a second NMOS FET that is coupled to the second terminal of the second capacitor at its source, that is coupled to the first terminal of the fifth switch at its gate, and coupled to the output terminal of the first amplifier at its drain.

5. The circuit of claim 1, wherein the signal dependent boost switch further comprises:
   a boost switch that is coupled to a first amplifier and to the sampling switch;
   a first sourcing switch that is coupled to a source;
   a boost capacitor that is coupled between the first sourcing switch and the boost switch; and a second sourcing switch that is coupled to the node between the boost capacitor and the first sourcing switch and that is coupled to the control electrodes of the boost switch and the sampling switch.

6. The apparatus of claim 5, wherein the boost switch and the sampling switch are transistors.

7. The apparatus of claim 6, wherein the signal dependent boost switch further comprises:
 a third sourcing switch that is coupled to the boost capacitor and ground; and
 a fourth sampling switch that is coupled to the control electrodes of the boost switch and the sampling switch and that is coupled to ground.

8. The apparatus of claim 1, wherein the storage element is a capacitor.

9. An apparatus comprising:
 a first amplifier that receives an input signal and that outputs a first amplified signal;
 a second amplifier that receives the input signal and that outputs a second amplified signal;
 a storage element;
 a first FET that is coupled to the second amplifier at its source and that is coupled to the storage element at its drain, wherein the first FET provides the second amplified signal to the storage element in at least one state; and
 a second FET that is coupled to the first amplifier at its drain and that is coupled to the gate of the first FET at its gate, wherein the first amplified signal maintains a substantially constant impedance for the first FET.

10. The apparatus of claim 9, wherein the apparatus further comprises:
 a first switch;
 a boost capacitor that is coupled between the first switch and the source of the second FET; and
 a second switch that is coupled to the node between the boost capacitor and the first switch and the gates of the first and second FETs.

11. The apparatus of claim 10, wherein the apparatus further comprises:
 a third switch that is coupled to the boost capacitor and ground; and
 a fourth switch that is coupled to the gates of the first and second FETs and that is coupled to ground.

12. The apparatus of claim 9, wherein the storage element is a capacitor.

13. A system comprising:
 processing circuitry that receives an input signal and that generates a processed signal;
 a sample-and-hold amplifier (SHA) that is coupled to the processing circuitry, wherein the SHA includes:
  a first amplifier that receives the processed signal and that outputs a first amplified signal;
  a second amplifier that receives the input signal and that outputs a second amplified signal;
  a storage element;
  a first FET that is coupled to the second amplifier at its source and that is coupled to the storage element at its drain, wherein the first FET provides the second amplified signal to the storage element in at least one state; and
  a second FET that is coupled to the first amplifier at its drain and that is coupled to the gate of the first FET at its gate, wherein the first amplified signal maintains a substantially constant impedance for the first FET; and
 an analog to digital converter (ADC) that is coupled to the storage element.

14. The system of claim 13, wherein the processing circuitry further comprises:
 a low noise amplifier (LNA) that receives the input signal;
 a mixer that is coupled to the LNA, wherein the mixer down-converts the amplified input signal into an intermediate signal; and
 a filter that is coupled to the mixer, wherein the intermediate signal is filtered to produce the processed signal.

15. The apparatus of claim 13, wherein the apparatus further comprises:
 a first switch;
 a boost capacitor that is coupled between the first switch and the source of the second FET; and
 a second switch that is coupled to the node between the boost capacitor and the first switch and the gates of the first and second FETs.

16. The apparatus of claim 15, wherein the apparatus further comprises:
 a third switch that is coupled to the boost capacitor and ground; and
 a fourth switch that is coupled to the gates of the first and second FETs and that is coupled to ground.

17. The apparatus of claim 13, wherein the storage element is a capacitor.

* * * * *